United States Patent

[11] 3,567,969

[72] Inventors Johnny W. Goode
West Point, Miss.;
Raymond A. Brandt, Huntsville, Ala.; The First National Bank of Huntsville, Administrator

[21] Appl. No. 751,010
[22] Filed Aug. 6, 1968
[45] Patented Mar. 2, 1971
[73] Assignee the United States of America as represented by the Secretary of Army

[54] HIGH POWER MODULATOR
3 Claims, 1 Drawing Fig.

[52] U.S. Cl. 307/253, 307/247, 307/260
[51] Int. Cl. H03k 17/00
[50] Field of Search 307/247, 239, 253, 260, 301; 328/195, 196, 201; 330/20, 24

[56] References Cited

UNITED STATES PATENTS

| | | | |
|---|---|---|---|
| 3,054,003 | 9/1962 | Pagano et al. | 307/247 |
| 3,327,134 | 6/1967 | Keane | 307/247 |

*Primary Examiner*—Donald D. Forrer
*Assistant Examiner*—B. P. Davis
*Attorneys*—Harry M. Saragovitz, Edward J. Kelly, Herbert Berl and Aubrey J. Dunn

ABSTRACT: A device providing medium voltage, high current switching into a load with nonlinear characteristics. The square wave output of a clocked flip-flop is amplified and used to operate a switching transistor which controls the power to the load.

PATENTED MAR 2 1971 3,567,969
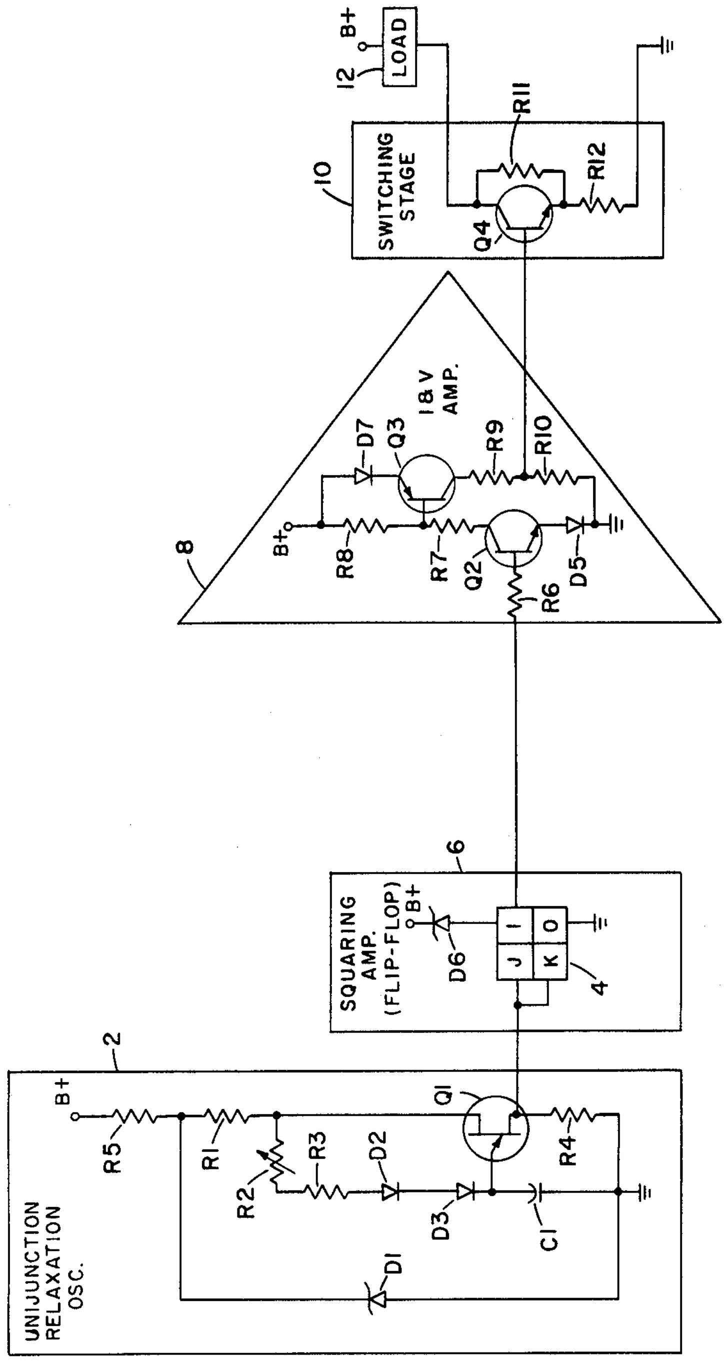
Johnny W. Goode
Raymond A. Brandt,
INVENTORS.
BY Harry M. Saragovitz
Edward J. Kelly
Herbert Berl
Aubrey J. Dunn

HIGH POWER MODULATOR

SUMMARY OF THE INVENTION

The present invention was designed to provide medium voltage, high current, square wave switching into a load having nonlinear characteristics. A relaxation oscillator is used to key a J-K flip-flop which produces a square wave output. The square wave output of the flip-flop is amplified and used to control a switching transistor which is connected in series with the load.

BRIEF DESCRIPTION OF THE DRAWING

The single FIGURE drawing is a schematic diagram of the present invention.

DESCRIPTION OF THE PREFERRED EMBODIMENT

Referring to the drawing, unijunction relaxation oscillator 2 serves as the modulator clock. The frequency of operation of unijunction transistor Q1 is determined by R2, R3, and C1. Diodes D2 and D3 provide frequency stability over a wide thermal range. Resistors R1 and R5 serve as series dripping resistors while zener diode D1 serves as a voltage regulator. The oscillator output occurs across R4, the unijunction base resistor. The pulses are positive going with R4 being selected for a minimum pulse amplitude compatible with the input requirements of flip-flop 4.

Integrated circuit flip-flop 4 is termed a squaring amplifier 6 since its output is independent of the wave shape of the input. The output state is changed each time the trailing edge of a positive input pulse goes from a minimum voltage to zero. The output of the flip-flop is a fast rise and fall time pulse. The width of the output pulses is one full period of the input frequency (1/f. nominally). Thus, the output frequency of the flip-flop is one half of the input frequency. Zener diode D6 drops B+ voltage to the proper operating voltage for flip-flop 4. Oscillator 2 and squaring amplifier 6 comprise a clocked flip-flop.

Amplifier 8 provides voltage and current gain. Transistors Q2 and Q3 are operated in the nonsaturated switching mode. Q2 has a voltage gain of approximately 10 and a current gain of 50. Q3 provides similar gains. The combined gain of these two stages provides sufficient drive to cause Q4 to operate in the saturated switching mode with supply voltages up to 60 volts and a maximum switching current of 30 amperes. Resistors R6, R7, R8, R9, and R10 are biasing resistors for transistors Q2, Q3, and Q4. Diodes D5 and D7 provide reverse bias for Q2 and Q3 in the off state. This affords minimum collector emitter leakage current at high ambient temperatures.

Switching stage 10 operates in the saturated switching mode and nominally switches 50 volts at 25 amperes. Resistor R11 provides a low quiescent current to flow through the load while Q4 is in the off state. Emitter resistor R12 is a low resistance ballast used because of the characteristics of the load. With transistor Q4 in the off state the quiescent voltage drop across R12 is used through R10 to maintain reverse biasing on Q4. With a purely resistive load, R12 may be replaced by two series diodes for reverse biasing purposes.

In operation, the output of relaxation oscillator 2 is used to key flip-flop 4. Flip-flop 4 produces a square wave output which is amplified by current and voltage amplifier 8 and used to control the switching of transistor Q4. Q4 is connected in series with load 12.

The present invention is capable of providing rise and fall times of less than 1 microsecond. This reduces device dissipation and allows sustained operation in high ambient temperatures without resulting in device destruction. All semiconductors are silicon which inherently may be operated at junction temperatures up to 150° C. This high power modulator will operate satisfactorily at 100° C. without significant deterioration of wave shape or speed.

While the invention has been described with reference to a preferred embodiment thereof, it will be apparent that various modifications and other embodiments thereof will occur to those skilled in the art within the scope of the invention. As examples, other oscillators could be substituted for the unijunction oscillator disclosed herein; other flip-flops could be substituted for the particular J-K flip-flop disclosed in the preferred embodiment; or any number of special clocked flip-flops could be substituted for the oscillator and flip-flop disclosed herein. Accordingly, we desire the scope of our invention to be limited only by the appended claims.

It is claimed:

1. A high power modulator comprising a clocked flip-flop, an amplifier, and a switch, said clocked flip-flop producing a square wave output which is amplified and used to control said switch; said amplifier providing voltage and current gain and comprising a first and second transistor; said square wave output being resistively connected to the base of said first transistor; a first diode, the emitter of said first transistor being connected to the cathode of said first diode, the anode of said first diode being connected to a common return and resistively connected to the output of said amplifier; the collector of said first transistor being resistively connected to the base of said second transistor; the base of said second transistor being resistively connected to a positive voltage; a second diode, the emitter of said second transistor being connected to the anode of said diode; the cathode of said second diode being connected to a positive voltage; the collector of said second transistor being resistively connected to said output of said amplifier.

2. A high power modulator as set forth in claim 1 wherein said switch comprises a third transistor; said output of said amplifier being connected to the base of said third transistor; the collector of said third transistor being resistively connected to the emitter of said third transistor and said common return; said collector of said third transistor being connected to a load whereby said third transistor switches power to the load responsive to said square wave output of said clocked flip-flop.

3. A high power modulator as set forth in claim 2 wherein said clocked flip-flop comprises a relaxation oscillator and a flip-flop having at least one input and one output, the output of said oscillator being connected to said input of said flip-flop, said output of said flip-flop being connected to the input of said amplifier, whereby said flip-flop provides said square wave output responsive to said relaxation oscillator.